(12) United States Patent
Masuda (10) Patent No.: US 6,923,363 B2
(45) Date of Patent: Aug. 2, 2005

(54) JOINING AGENT FOR METAL OR CERAMIC, AND METHOD FOR JOINING METAL ARTICLES OR CERAMIC ARTICLES USING THE SAME

(75) Inventor: Tsugio Masuda, Sayama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/490,804

(22) PCT Filed: Sep. 24, 2002

(86) PCT No.: PCT/JP02/09756
§ 371 (c)(1),
(2), (4) Date: Mar. 25, 2004

(87) PCT Pub. No.: WO03/029165
PCT Pub. Date: Apr. 10, 2003

(65) Prior Publication Data
US 2004/0195294 A1 Oct. 7, 2004

(30) Foreign Application Priority Data
Sep. 27, 2001 (JP) .................................. 2001-297796

(51) Int. Cl.⁷ ............................................... B23K 31/02
(52) U.S. Cl. .................................................. 228/122.1
(58) Field of Search ............................... 228/122.1, 245, 228/247, 248.5, 248.1; 148/24

(56) References Cited

U.S. PATENT DOCUMENTS

| 5,125,557 A | * | 6/1992 | Tanaka et al. ............... 228/121 |
| 5,393,558 A | * | 2/1995 | Allison et al. ............ 427/126.2 |
| 5,451,279 A | * | 9/1995 | Kohinata et al. ......... 156/89.27 |
| 5,733,644 A | * | 3/1998 | Tanaka et al. .............. 428/215 |

FOREIGN PATENT DOCUMENTS

| JP | 56-115805 | 9/1981 |
| JP | 05-194048 | 8/1993 |
| JP | 11-220073 | 8/1999 |

\* cited by examiner

*Primary Examiner*—Jonathan Johnson
(74) *Attorney, Agent, or Firm*—Rankin, Hill, Porter & Clark LLP (57) ABSTRACT

A bonding agent for metals or ceramics comprising 0.25 to 18.0% by weight of a powder of Mg and 25 to 50% by weight of a hydroxyl solvent, the balance of its composition being a powder of AlN. The bonding agent having the constituents stated above has a large amount of reaction heat generated by the reaction of its constituents. This reaction heat destroys thermally any strong oxide film existing on the surface of a base body or a part to be joined thereto, and forming a barrier layer hindering their bonding when the base body and the part to be joined thereto are of an aluminum alloy.

3 Claims, 7 Drawing Sheets

JOINING AGENT FOR METAL OR CERAMIC, AND METHOD FOR JOINING METAL ARTICLES OR CERAMIC ARTICLES USING THE SAME

TECHNICAL FIELD

This invention relates to a bonding agent based on inorganic constituents for bonding metallic or ceramic parts together and, more particularly, to a bonding agent for metallic or ceramic parts of which hardening is promoted by heating, and a bonding process for metallic or ceramic parts employing the same.

BACKGROUND OF THE INVENTION

Soldering (brazing), or a bonding method relying upon an organic adhesive is known as a method of bonding metallic or ceramic parts together.

A bonding method relying upon an organic adhesive requires costly equipment for maintaining a proper working environment, as it uses an organic solvent, such as toluene. Moreover, it requires costly equipment for the disposal of a contaminated organic solvent.

Soldering does not involve any problem of environment or waste disposal, but requires the heating of a base body and a part to be joined thereto with a solder in a vacuum oven to the melting temperature of the solder (640° C.). The exposure of the base body, etc. to such a high temperature causes its thermal deformation due to a difference in temperature between its surface and interior, or between its upper and lower surfaces. It is usual to apply a high pressure to the base body to suppress its thermal deformation. Thus, soldering brings about a high cost of manufacture, insofar as it requires some measure to be taken to protect the base body, etc. from deformation caused by its heating to a high temperature.

DISCLOSURE OF THE INVENTION

According to a first aspect of this invention, there is provided a bonding agent for metals or ceramics comprising 0.25 to 18.0% by weight of a powder of Mg and 25 to 50% by weight of a hydroxyl solvent, the balance of its composition being a powder of AlN.

The bonding agent having the constituents stated above has a large amount of reaction heat generated by the reaction of its constituents. This reaction heat destroys thermally any strong oxide film existing on the surface of the base body or the part to be joined thereto, and forming a barrier layer hindering their bonding when the base body and the part to be joined thereto are of an aluminum alloy.

A method relying upon a combination of self-generated heat and heat added from outside, or a method relying solely upon heat added from outside is available as a method of obtaining heat for destroying the oxide film as stated above. The method relying upon a combination of self-generated heat and heat added from outside requires only less heat added from outside than the method relying solely upon heat added from outside does. The less heat added from outside makes it possible to restrict any elevation in temperature of the base body and the part to be joined thereto. The restriction of any elevation in temperature makes it possible to lower the temperature of the base body and the part to be joined thereto. If their temperature is lower than what has hitherto been possible, it is not necessary to take any special measure for preventing their thermal deformation. Even when any measure may be taken for preventing deformation, it is sufficient for any such measure to employ only a low holding pressure.

Although any known organic adhesive may produce harmful gas, this invention does not produce any such gas, but can maintain a good environment.

The hydroxyl solvent may be water.

According to a second aspect of this invention, there is provided a metal or ceramic bonding process comprising: a kneading step in which a powder of Mg and a powder of AlN are kneaded for a bonding agent comprising 0.25 to 18.0% by weight of powder of Mg and 25 to 50% by weight of a hydroxyl solvent, the balance of its composition being the powder of AlN; a mixing step in which 25 to 50% by weight of hydroxyl solvent is mixed with the kneaded powders immediately before application; a coating step in which the bonding agent as obtained is applied to coat at least one of a metallic or ceramic base body and a part to be joined thereto; an intimate contact step in which the part is brought into intimate contact with the base body by the bonding agent; and a heating step in which the base body and the part held in intimate contact with each other are heated to 150 to 500° C. so that their bonding may be promoted.

The powders are mixed uniformly by kneading before the addition of the hydroxyl solvent, whereby their later reaction takes place more easily.

As the addition of the hydroxyl solvent to the kneaded powders starts their reaction, this step is carried out immediately before application.

The heat for destroying a strong oxide film thermally is obtained by a combination of self-generated heat and heat added from outside. Thus, heating to 150 to 500° C. is sufficient for destroying a strong oxide film. 150 to 500° C. is sufficiently lower than the temperature to be reached when only heat from outside is employed.

BRIEF DESCRIPTION OF THE INVENTION

BEST MODE FOR CARRYING OUT THE INVENTION

The preferable range of the constituents of the bonding agent according to this invention will first be explained in accordance with the following proportional expressions:

AlN:Mg:H$_2$O = 8:3:12 (factor ratio)

= 328:72:216 (weight ratio)

= 53 wt %:12 wt %:35 wt %

AlN has a molecular weight of 41 (the sum of the atomic weights), which makes 328 when multiplied by 8. Mg has an atomic weight of about 24, which makes 72 when multiplied by 3. H$_2$O has a molecular weight of 18, which makes 216 when multiplied by 12.

Thus, 8:3:12 (factor ratio) is expressed as 328:72:216 when converted to the weight ratio. Its conversion to the percentage gives 53 wt %: 12 wt %: 35 wt %. In other words, AlN has a preferable proportion of 53% by weight, Mg has a preferable proportion of 12% by weight and H$_2$O has a preferable proportion of 35% by weight. These proportions can, however, be broadened for practical application.

It has been found experimentally that when Mg is less than 0.25% by weight, the reaction according to the chemical reaction formula appearing below does not proceed satisfactorily. It has also been found that when Mg is over 18% by weight, an excess of Al$_2$MgO$_4$ is formed and brings about a reduction in bonding strength. Accordingly, Mg is in the range of 0.25 to 18% by weight.

As regards the hydroxyl solvent, it has been found that when it is less than 25% by weight, the above reaction does not proceed satisfactorily, but forms a bonding agent that is not in the form of a paste and is not applicable for satisfactory coating. It has also been found that when the hydroxyl solvent is over 50% by weight, the resulting product is too high in fluidity for successful coating. Accordingly, the hydroxyl solvent is in the range of 25 to 50% by weight.

Figure 1:
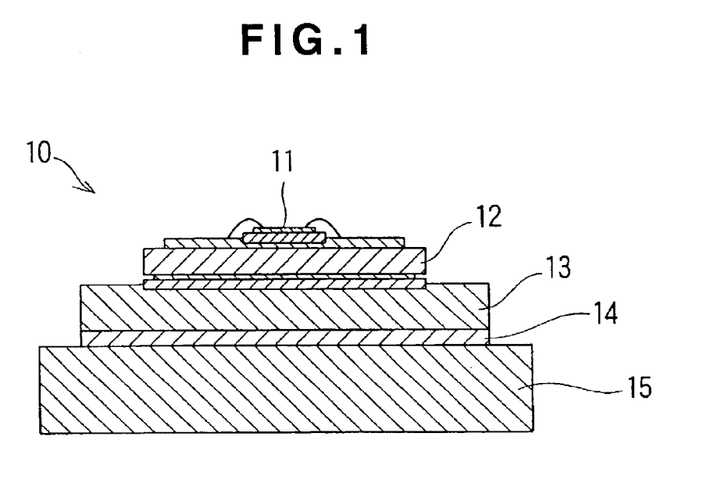
FIG. 1 is a cross-sectional view of a high-current power device made by a bonding process according to this invention.

Reference is now made to FIG. 1 showing in cross section a high-current power device made by the bonding process according to this invention.

The high-current power device 10 comprises a semiconductor element 11, an insulating base 12 supporting the semiconductor element 11, a heat spreader 13 bonded to the insulating base 12 and a heat sink 15 bonded to the heat spreader 13 by a bonding agent 14 according to this invention.

The heat generated by the semiconductor element 11 is transmitted to the heat spreader 13 and then the heat sink 15 and dissipated away, so that any elevation in temperature of the semiconductor element 11 may be restrained.

Explanation will now be made as to the materials of the individual components.

The insulating base 12 is made of aluminum nitride.

The heat spreader 13 is made of aluminum, copper or silicon carbide (SiC) having a high thermal conductivity.

The heat sink 15 is also made of aluminum, copper or silicon carbide having a high thermal conductivity.

A bonding method for a high-current power device having the construction described above will now be described with reference to FIGS. 2A to 2C.

Figure 2A:
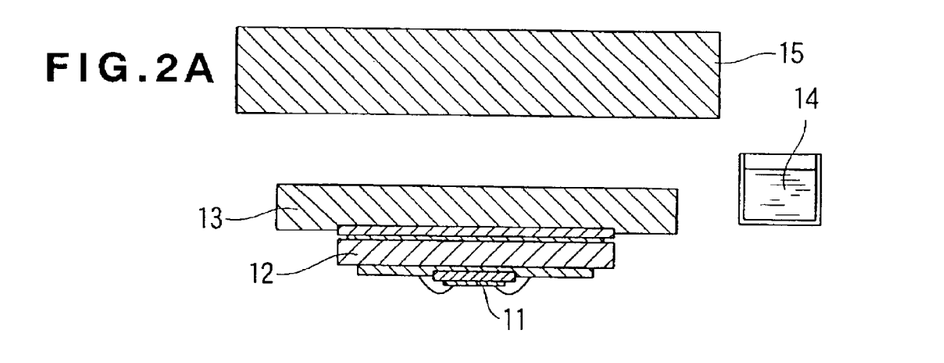
FIGS. 2A to 2C are diagrams outlining a method of joining parts for a high-current power device by using a bonding agent according to this invention.

A heat spreader 13 provided with a semiconductor element 11 and an insulating base 12, a heat sink 15 and a bonding agent 14 are prepared as shown in FIG. 2A.

The heat spreader 13 and the heat sink 15 are of different kinds of metals, as the heat spreader is of aluminum (having a purity of 99.99%), while the heat sink is of an aluminum alloy A5052 (JIS: an aluminum alloy containing 2.5 Mg and 0.25 Cr).

50% by weight of a powder of AlN, 10% by weight of a powder of Mg and 40% by weight of water are prepared for the bonding agent 14. Moreover, an Al powder seven times as much as the AlN powder is prepared as an additive, since the heat spreader 13 and the heat sink 15 are of aluminum or an aluminum alloy. The AlN powder (50% by weight), Mg powder (10% by weight) and Al powder (seven times as much as the AlN powder) are first kneaded together thoroughly in a mortar. Water (40% by weight) is mixed with the kneaded powders to form the bonding agent 14 containing the additive.

Figure 2B:
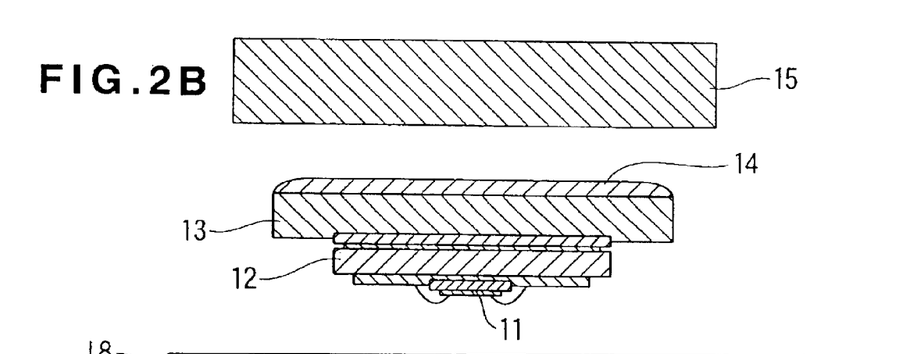

Then, the bonding agent 14 is applied to coat the heat spreader 13, as shown in FIG. 2B. The heat sink 15 is placed on the bonding agent 14. The bonding agent 14 may alternatively be applied to the heat sink 15.

Figure 2C:
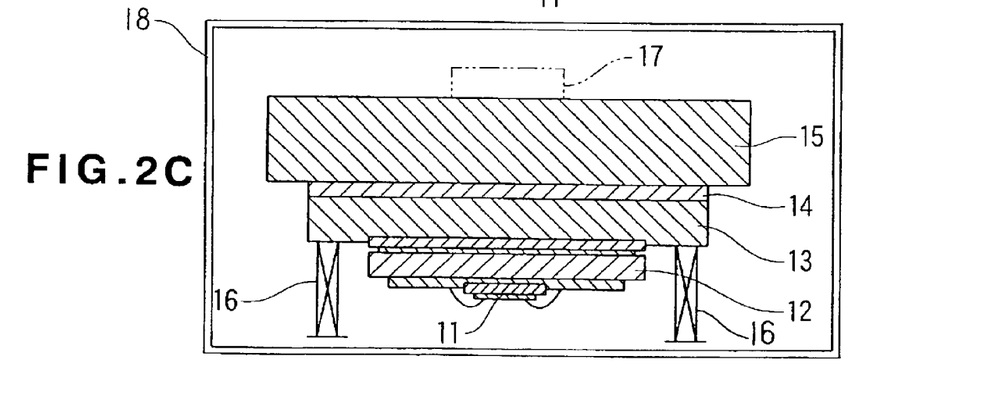

Then, the whole is charged in a vacuum heating oven 18, while the heat spreader 13 is placed on supports 16, as shown in FIG. 2C. As a result, the weight of the heat sink 15 bears upon the bonding agent 14. This load ought to produce a pressure of about 2 MPa. If it does not reach 2 MPa, a weight 17 making up the shortage may be placed on the heat sink 15, as shown by an imaginary line. The vacuum oven is evacuated, and then, nitrogen is blown thereinto to create a nitrogen atmosphere having an oxygen concentration of 3 to 20 ppm.

Heating is started at a heating rate of 10° C./min. for a target temperature of 150° C., and after 150° C. is reached, two hours are allowed to pass. The reaction expressed by the following chemical formula takes place in the meantime and eventually produces 1120 kJ of reaction heat. This reaction heat serves as a part of heat required for the thermal destruction of any strong oxide film formed on the surface of a base body or a part to be joined thereto when it is of an aluminum alloy.

8AlN+3Mg+12H$_2$O−3Al$_2$MgO$_4$+2Al+
8NH$_3$−1120 kJ    (reaction heat)

The product taken out from the vacuum heating oven 18 was the power device 10 shown in FIG. 1. The power device 10 was examined for its mechanical properties. Their details are shown in a table below.

| Base body | Part joined to it | Heating temp. | Load pressure | Joint thickness | Tensile strength | Broken portion |
|---|---|---|---|---|---|---|
| Heat spreader (A5052) | Heat sink (pure Al) | 150° C. | 2 MPa | About 100 μm | About 20 MPa | Inside the part joined to it |

The joint, or the bonding agent 14 had a thickness of about 100 μm, and its tensile breaking test, as well as the measurement of its tensile strength, was conducted by using a tensile testing machine. As a result, it showed a tensile strength of about 20 MPa and it was in the part joined, or the heat spreader 13 that had been broken. Thus, it was confirmed that the joint obtained by the process of this invention employing the bonding agent according to this invention was comparable in adhesive strength to any known product.

The following was the reason for the heating temperature set at 150° C.

Referring to FIG. 2A, the semiconductor element 11 is secured to the insulating base 12 by solder. As the solder softens or melts at 180° C., the heating as shown in FIG. 2C has to be carried out at less than 180° C.

As the bonding agent 14 according to this invention was expected to generate heat by itself, it was confirmed that strength comparable to what had already been possible could be obtained by outside heating at 125° C.

Thus, a middle point between 125° C. and 180° C. was chosen as 150° C. for the embodiment described above.

However, as bonding strength depends on temperature, there is also a demand calling for an outside heating temperature of 180° C. or above for achieving high strength. A corresponding embodiment will now be described with reference to FIGS. 3A to 3D.

Figure 3A:
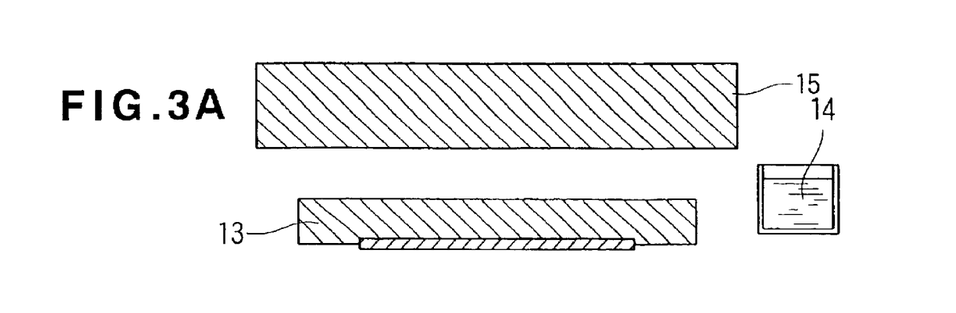
FIGS. 3A to 3D are diagrams outlining a method of joining parts for a high-current power device by employing different conditions and steps from those shown in FIGS. 2A to 2C.

A heat spreader 13, a heat sink 15 and a bonding agent 14 are first prepared as shown in FIG. 3A. The heat spreader 13 and the heat sink 15 are of different kinds of metals, as the heat spreader is of aluminum (having a purity of 99.99%), while the heat sink is of an aluminum alloy A5052 (an aluminum alloy containing 2.5 Mg and 0.25 Cr).

50% by weight of a powder of AlN, 10% by weight of a powder of Mg and 40% by weight of water are prepared for the bonding agent 14. Moreover, an Al powder seven times as much as the AlN powder is prepared as an additive, since the heat spreader 13 and the heat sink 15 are of aluminum or an aluminum alloy. The AlN powder (50% by weight), Mg powder (10% by weight) and Al powder (seven times as much as the AlN powder) are first kneaded together thoroughly in a mortar. Water (40% by weight) is mixed with the kneaded powders to form the bonding agent 14 containing the additive.

Figure 3B:
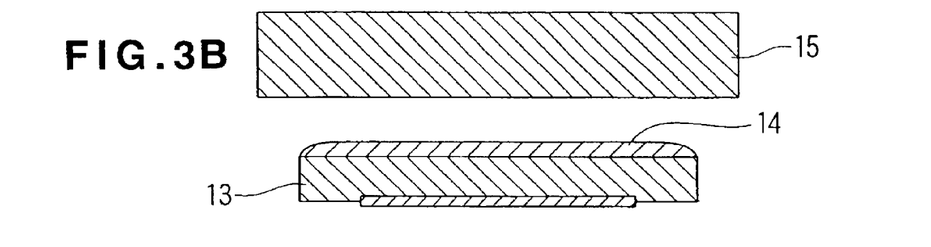

Then, the bonding agent 14 is applied to coat the heat spreader 13, as shown in FIG. 3B. The heat sink 15 is placed on the bonding agent 14. The bonding agent 14 may alternatively be applied to the heat sink 15.

Figure 3C:
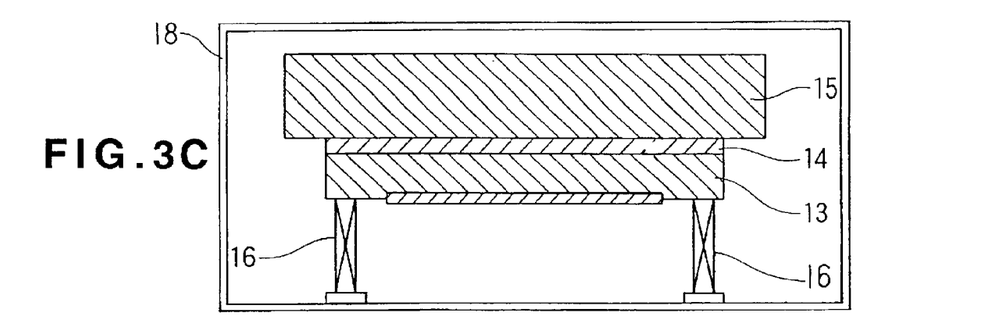

Then, the whole is charged in a vacuum heating oven 18, while the heat spreader 13 is placed on supports 16, as shown in FIG. 3C. As a result, the weight of the heat sink 15 bears upon the bonding agent 14. This load ought to produce a pressure of about 2 MPa. If it does not reach 2 MPa, a weight making up the shortage may be placed on the heat sink 15. The vacuum heating oven 18 is evacuated, and then, nitrogen is blown thereinto to create a nitrogen atmosphere having an oxygen concentration of 3 to 20 ppm.

Heating is started at a heating rate of 10° C./min. for a target temperature of 600° C., and after 600° C. is reached, two hours are allowed to pass.

Figure 3D:
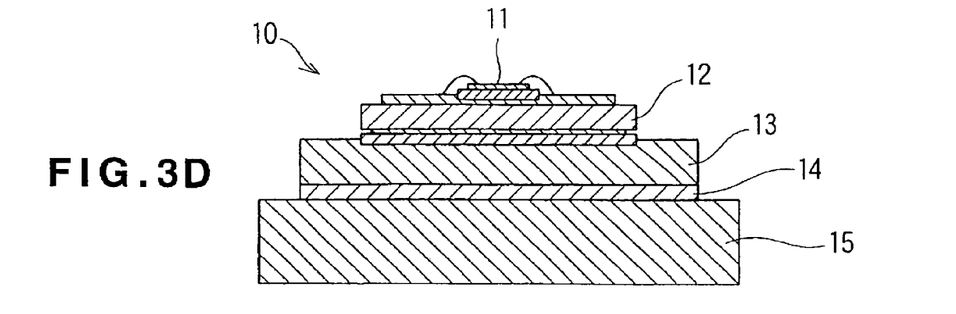

Finally, a semiconductor element 11 and an insulating base 12 are joined by solder, etc. to the heat spreader 13 after removal from the vacuum heating oven 18 and inversion. As a result, a high-current power device is completed as shown in FIG. 3D.

An example in which the bonding process according to this invention was applied to the bonding of engine parts will now be described with reference to FIGS. 4A to 4C.

Figure 4A:
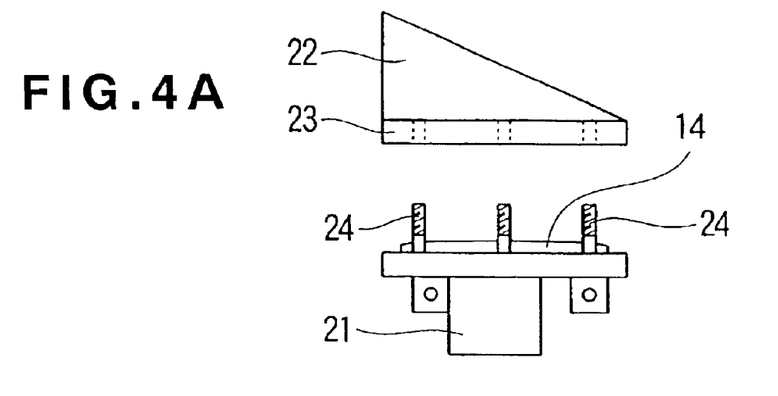
FIGS. 4A to 4C are diagrams outlining a method of joining an engine cylinder and a cylinder head.

An engine cylinder 21 and a head 23 having a fin 22 are first prepared as shown in FIG. 4A. The cylinder 21 has bolts 24 attached to it beforehand. The cylinder 21 is made of an aluminum die-casting (JIS-ADC-12) and the head 23 is also of an aluminum die-casting (JIS-ADC-12).

The cylinder 21 has its top surface coated with a bonding agent 14. The bonding agent 14 is of the same composition as what has been described before.

Figure 4B:
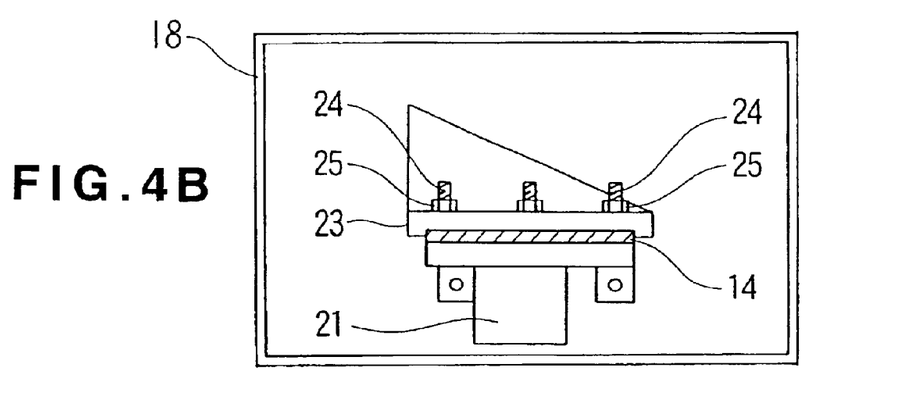

Then, the head 23 is placed on the cylinder 21, and nuts 25 are put on the bolts 24 and turned to press the head 23 against the cylinder 21, as shown in FIG. 4B. Their pressure is adjusted to 2 MPa. Thus, the bolts 24 and the nuts 25 perform the function of a mechanical jack. Then, the cylinder 21 and the head 23 are placed in a vacuum heating oven 18. The vacuum heating oven 18 is evacuated, and then, nitrogen is blown thereinto to create a nitrogen atmosphere having an oxygen concentration of 3 to 20 ppm.

Heating is started at a heating rate of 10° C./min. for a target temperature of 400° C., and after 400° C. is reached, two hours are allowed to pass. The reaction expressed by the following chemical formula takes place in the meantime and eventually produces 1120 kJ of reaction heat. This reaction heat serves as a part of heat required for the thermal destruction of any strong oxide film formed on the surface of a base body or a part to be joined thereto when it is of an aluminum alloy.

$$8AlN+3Mg+12H_2O \rightarrow 3Al_2MgO_4+2Al+8NH_3-1120 \text{ kJ} \quad \text{(reaction heat)}$$

Figure 4C:
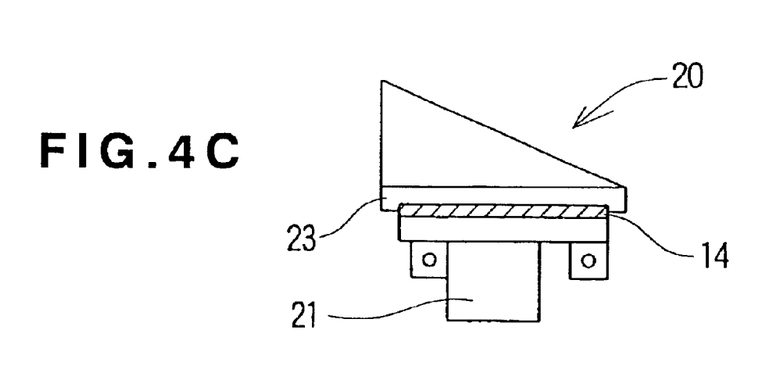

Finally, the bolts and nuts are removed from what has been taken out from the vacuum heating oven, whereby a completed cylinder-head assembly 20 is obtained as shown in FIG. 4C. While it has hitherto been usual to join a head to a cylinder with bolts, this invention employs the bonding agent 14 for joining them together.

The cylinder-head assembly 20 was examined for its mechanical properties. Their details are shown in a table below.

| Base body | Part joined to it | Heating temp. | Load pressure | Joint thickness | Tensile strength | Broken portion |
|---|---|---|---|---|---|---|
| Cylinder (ADC12) | Head (ADC12) | 400° C. | 2 Mpa | About 85 μm | About 75 MPa | Inside the base body |

The joint, or the bonding agent 14 had a thickness of about 85 μm, and its tensile breaking test, as well as the measurement of its tensile strength, was conducted by using a tensile testing machine. As a result, it showed a tensile strength of about 75 MPa and it was in the base body, or the cylinder 21 that had been broken. Thus, it was confirmed that the joint obtained by the process of this invention employing the bonding agent according to this invention was satisfactory in strength.

Referring to the temperature of outside heating for promoting the adhesion of the bonding agent, it has to be 125° C. or higher to obtain the strength comparable to what has hitherto been obtained. It is, however, desirable not to exceed 600° C. in view of the necessity of employing a temperature lower than the soldering temperature (about 640° C.) to prevent deformation by temperature. Therefore, the outside heating temperature is selected from the range of 125 to 600° C.

Moreover, at least 150° C. is necessary for ensuring at least a predetermined strength and it is necessary not to exceed 500° C. to suppress any deformation by temperature thoroughly. Therefore, a preferred outside heating temperature is selected from the range of 150 to 500° C.

The additive to be added to the bonding agent according to this invention is so altered as to suit the nature of the base body, or the part to be joined to it. The additive is, for example, a powder of Ni if the joining surfaces are plated with Ni.

An example in which the bonding process according to this invention is used for manufacturing a cylinder block will now be described with reference to FIGS. 5 to 9.

Figure 5:
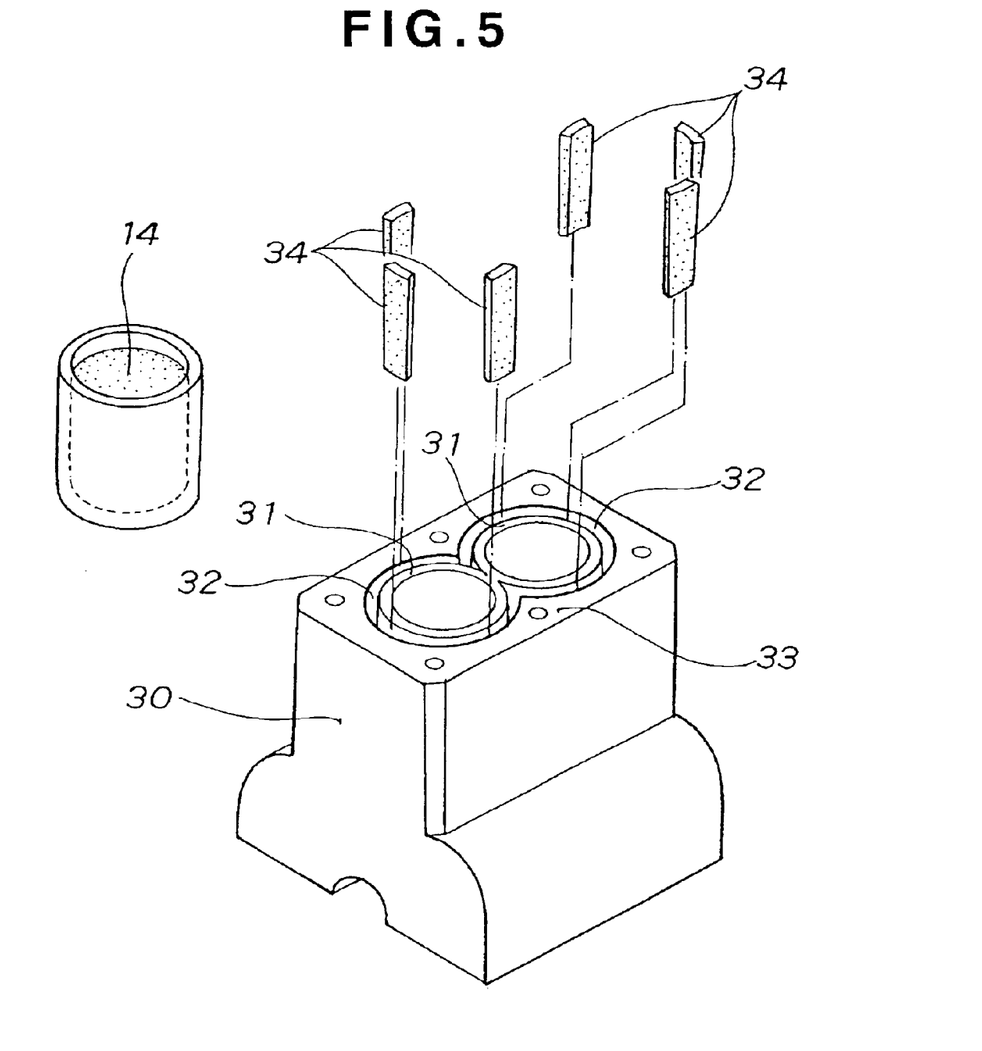
FIG. 5 is a diagram outlining a preparatory stage in a job for joining parts for a cylinder block.

A cylinder block 30 formed by an aluminum casting, aluminum alloy pieces 34 and a bonding agent 14 are first prepared as shown in FIG. 5. Their details will be explained in their order.

The cylinder block 30 is an aluminum casting having adjoining cylinders 31 formed in close proximity to each other and having a narrow cylinder spacing, while water-cooling jackets 32 surrounding the cylinders 31 are open like rings in its surface 33 mating with a cylinder head. What has adjoining cylinders 31 formed in close proximity to each other as in the present example is called a Siamese type cylinder block. The aluminum casting is preferably an aluminum die-casting having its composition specified in JIS-ADC-12.

The aluminum alloy pieces 34 have a thickness corresponding to the clearances defining the water-cooling jackets 32, and may be castings, or rolled products.

Figure 6:
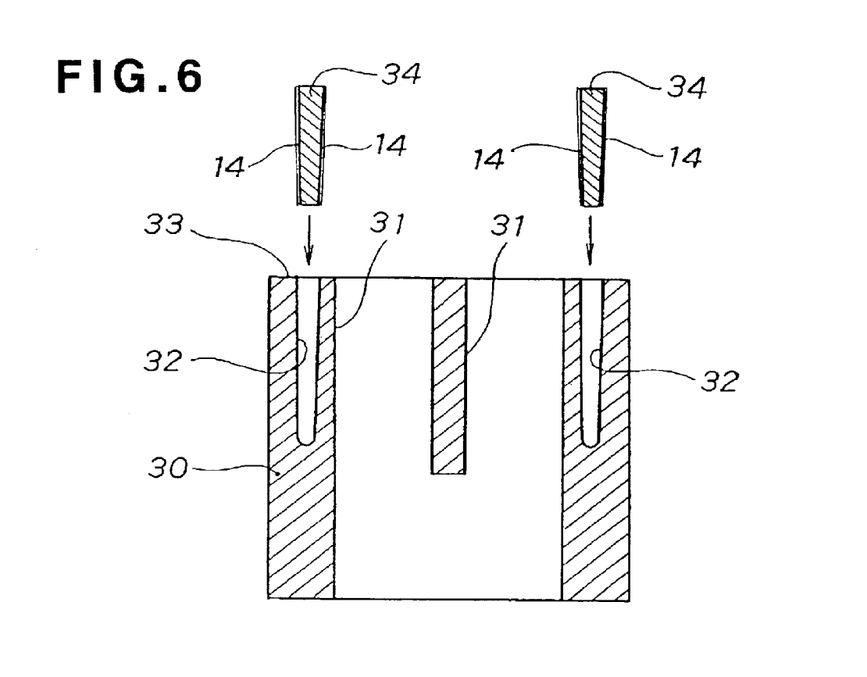
FIG. 6 is a diagram outlining a method of inserting an aluminum alloy piece in a cylinder.

Referring to FIG. 6, the aluminum alloy piece 34 shown on its left-hand side is inserted into the water-cooling jacket 32 as shown by an arrow after it has been coated with the bonding agent 14 on both sides. The same is true of the aluminum alloy piece 34 shown on the right-hand side.

Figure 7:
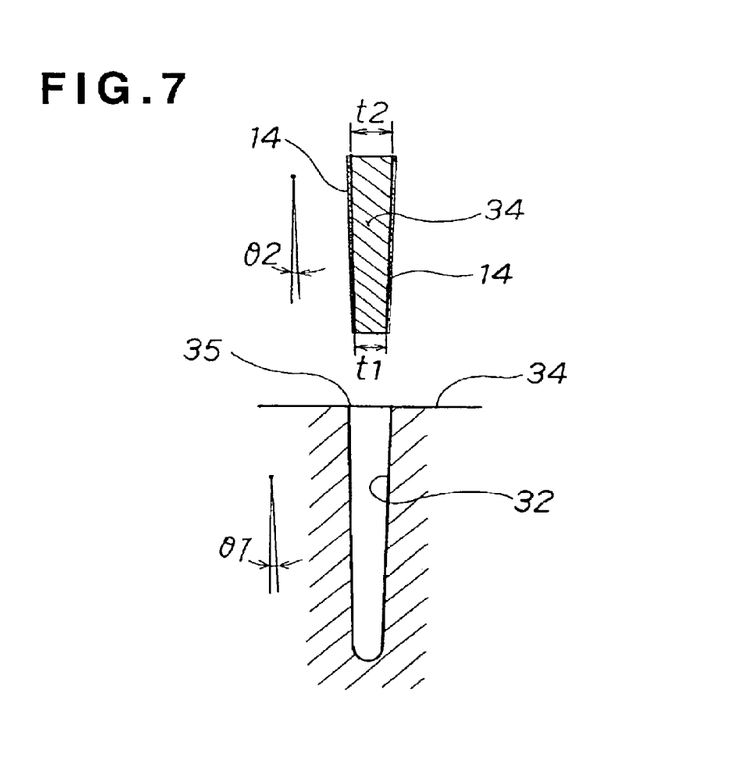
FIG. 7 is a diagram outlining details of the method shown in FIG. 6 for inserting an aluminum alloy piece.

Referring to FIG. 7, the water-cooling jacket 32 preferably has a tapered shape widening toward its opening 35 for easy mold release. The cylinder block is, thus, easy to remove from the mold after its casting. The inclination θ1 corresponds to the release inclination formed in the casting mold.

It is desirable for the aluminum alloy piece 34 to have correspondingly a wedge-shaped cross section defined by its top end thickness t2 greater than its bottom end thickness t1. This taper angle of the piece is denoted as θ2.

Although it is, as a rule, usual to set θ1=θ2, it is also possible to set θ1<θ2.

The following is the reason. When θ1<θ2, it is necessary to press fit the aluminum alloy piece 34 in the water-cooling jacket 32 with a strong force. Its press fitting exerts a reactive (compressive) force upon the bonding agent 14.

Figure 8:
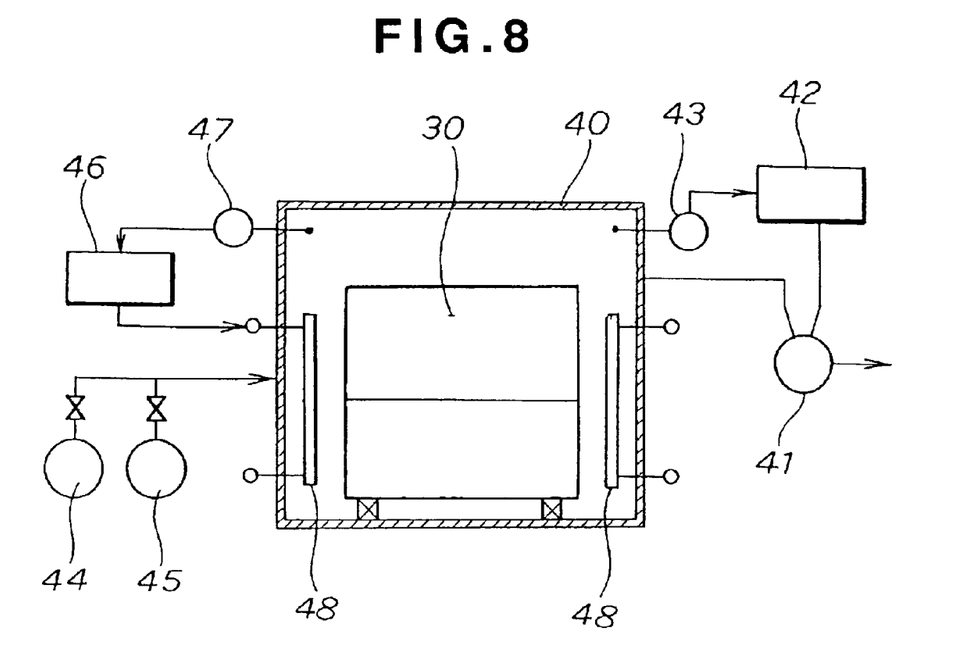
FIG. 8 is a diagram outlining a method of heating in the job for joining parts for a cylinder block.

Then, the cylinder block 30 is placed in a vacuum heating oven 40 as shown in FIG. 8. It is desirable for a compressive force of about 2 MPa to be exerted upon the bonding agent 14 by the wedge action mentioned above, any other mechanical clamp, or any other alternative method.

A vacuum pump 41 is operated to evacuate the oven. A pressure control device 42 detects the oven pressure by a pressure sensor 43 and causes the vacuum pump 41 to work so that the oven pressure may reach a predetermined vacuum degree.

Then, gas is blown into the oven from a nitrogen container 44, or an inert gas container 45 filled with argon gas or the like to create a nitrogen or inert gas atmosphere having an oxygen concentration of 3 to 20 ppm in the oven.

Then, heating is started at a heating rate of 10° C./min. for a target temperature of 400° C., and after 400° C. is reached, two hours are allowed to pass. A temperature control device 46 detects the oven temperature by a temperature sensor 47 and regulates the heat input of heaters 48 to raise the oven temperature to the target temperature at the heating rate stated above.

The reaction expressed by the following chemical formula takes place in the meantime and eventually produces 1120 kJ of reaction heat. This reaction heat serves as apart of heat required for the thermal destruction of any strong oxide film formed on the surface of a base body or a part to be joined thereto when it is of an aluminum alloy.

(reaction heat)

Figure 9:
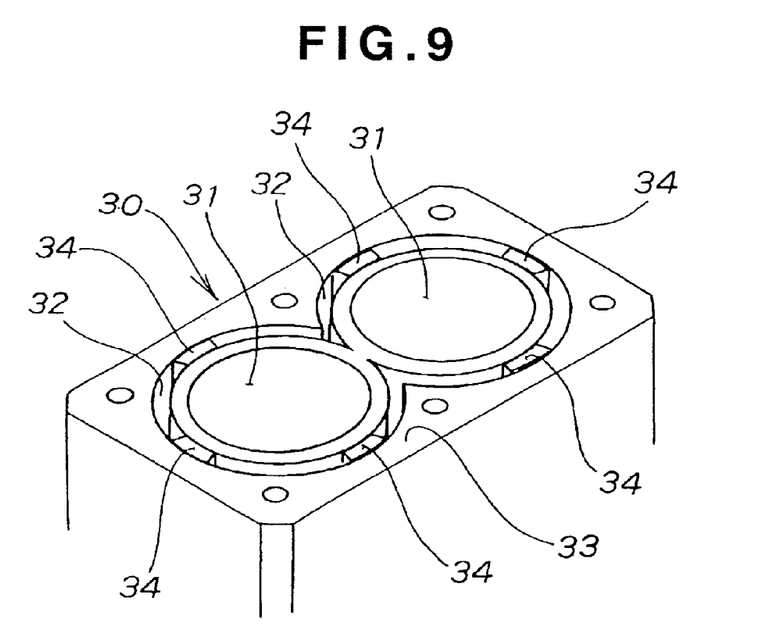
FIG. 9 a perspective view of an essential part of a cylinder block as completed.

Finally, the heating oven 40 is discharged to yield a completed cylinder block 30 as shown in FIG. 9. The cylinder block 30 has a plurality of aluminum alloy pieces 34 fitted and secured with the bonding agent in the water-cooling jackets 32 surrounding the cylinders 31 and open like rings in its surface 33 mating with the cylinder head.

The aluminum alloy pieces 34 were examined for their adhesive strength to the cylinder block 30. Its details are shown in a table below.

| Base body | Part joined to it | Heating temp. | Load pressure | Joint thickness | Tensile strength | Broken portion |
|---|---|---|---|---|---|---|
| Cylinder block (ADC12) | Aluminum alloy pieces | 400° C. | 2 Mpa | About 85 μm | About 75 MPa | Inside the parts joined |

The joint, or the bonding agent 14 had a thickness of about 85 μm, and its tensile breaking test, as well as the measurement of its tensile strength, was conducted by using a tensile testing machine. As a result, it showed a tensile strength of about 75 MPa and it was in the parts joined, or the aluminum alloy pieces 34 that had been broken. Thus, it was confirmed that the joint obtained by the process of this invention employing the bonding agent according to this invention was satisfactory in strength.

Referring to the temperature of outside heating for promoting the adhesion of the bonding agent, it has to be 125° C. or higher to obtain the strength comparable to what has hitherto been obtained. It is, however, desirable not to exceed 600° C. in view of the necessity of employing a temperature lower than the soldering temperature (about 640° C.) to prevent deformation by temperature. Therefore, the outside heating temperature is selected from the range of 125 to 600° C.

Moreover, at least 150° C. is necessary for ensuring at least a predetermined strength and it is necessary not to exceed 500° C. to suppress any deformation by temperature thoroughly. Therefore, a preferred outside heating temperature is selected from the range of 150 to 500° C.

The additive to be added to the bonding agent according to this invention is so altered as to suit the nature of the base body, or the part to be joined to it. The additive is, for example, a powder of Ni if the joining surfaces are plated with Ni.

The aluminum alloy pieces may be changed to aluminum alloy rings fitted in the openings of the water-cooling jackets. If such rings are coated with a bonding agent, set in the openings of the water-cooling jackets, and fixed by heating, it is possible to obtain a closed deck type cylinder block. An open deck type cylinder block has a low casting cost, but a closed deck type cylinder block has a high casting cost. A lower casting cost can, therefore, be achieved if an open deck type cylinder block is cast and changed to a close deck type cylinder block by applying the process of this invention.

Moreover, the cylinder block may have only one cylinder, or three or more cylinders, though the embodiment has been described with a two-cylinder cylinder block. This invention is applicable to not only a Siamese type cylinder block, but also a non-Siamese type cylinder block.

INDUSTRIAL APPLICABILITY

The bonding agent and process according to this invention are useful for the manufacture of engines and electrical apparatus, since they realize satisfactorily the joining of metallic or ceramic parts for, e.g., an engine or a high-current power device.

What is claimed is:

1. A bonding agent for metals or ceramics comprising 0.25 to 18.0% by weight of a powder of Mg and 25 to 50% by weight of a hydroxyl solvent, the balance of its composition being a powder of AlN.

2. The bonding agent for metals or ceramics according to claim 1, characterized in that the hydroxyl solvent is water.

3. A metal or ceramic bonding process comprising the steps of:
    kneading a powder of Mg and a powder of AlN to produce a bonding agent comprising 0.25 to 18.0% by weight of powder of Mg and 25 to 50% by weight of a hydroxyl solvent, the balance composition of the bonding agent being the powder of AlN;
    mixing 25 to 50% by weight of hydroxyl solvent with the kneaded powders immediately before application;
    coating at least one of a metallic or ceramic base body and a part to be joined thereto with the bonding agent;
    bringing the part into intimate contact with the base body by the bonding agent; and
    heating the base body and the part held in intimate contact with the base body to 150 to 500° C. and thereby promoting bonding between the base body and the part.

* * * * *

UNITED STATES PATENT AND TRADEMARK OFFICE
CERTIFICATE OF CORRECTION

PATENT NO. : 6,923,363 B2
DATED : August 2, 2005
INVENTOR(S) : Masuda

It is certified that error appears in the above-identified patent and that said Letters Patent is hereby corrected as shown below:

Column 9,
Lines 2, 7 and 11, delete "AIN" and insert -- AlN --.

Signed and Sealed this

Fourth Day of October, 2005

JON W. DUDAS
*Director of the United States Patent and Trademark Office*